(12) United States Patent
Low et al.

(10) Patent No.: US 6,963,138 B2
(45) Date of Patent: Nov. 8, 2005

(54) DIELECTRIC STACK

(75) Inventors: Qwai H. Low, Cupertino, CA (US); Chok J. Chia, Cupertino, CA (US); Ramaswamy Ranganathan, Saratoga, CA (US); Tauman T. Lau, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 81 days.

(21) Appl. No.: 10/357,142

(22) Filed: Feb. 3, 2003

(65) Prior Publication Data

US 2004/0150069 A1     Aug. 5, 2004

(51) Int. Cl.⁷ ............................................. H01L 23/48
(52) U.S. Cl. ..................... 257/760; 257/758
(58) Field of Search ................. 257/760, 758

(56) References Cited

U.S. PATENT DOCUMENTS

| | | | |
|---|---|---|---|
| 5,744,865 A * | 4/1998 | Jeng et al. ................... | 257/750 |
| 5,753,564 A * | 5/1998 | Fukada ....................... | 438/624 |
| 5,880,018 A * | 3/1999 | Boeck et al. ............... | 438/619 |
| 6,064,118 A * | 5/2000 | Sasaki ........................ | 257/758 |
| 6,388,331 B1 | 5/2002 | Bond et al. | |
| 6,614,091 B1 * | 9/2003 | Downey et al. ............ | 257/499 |
| 6,625,882 B1 | 9/2003 | Saran et al. | |
| 6,798,035 B1 * | 9/2004 | Low et al. ................... | 257/459 |

* cited by examiner

*Primary Examiner*—Jerome Jackson
*Assistant Examiner*—N. Drew Richards
(74) *Attorney, Agent, or Firm*—Luedeka, Neely & Graham, P.C.

(57) ABSTRACT

An integrated circuit with a pressure resistant current carrying structure having electrically conductive layers for carrying current. A first electrically nonconductive material at least partially surrounds the electrically conductive layers, and provides electrical insulation between the electrically conductive layers. The first electrically nonconductive material has a first degree of fragility and a first dielectric constant. A second electrically nonconductive material is disposed in a pattern within the first electrically nonconductive material and between the electrically conductive layers, and provides structural support for the first electrically nonconductive material between the electrically conductive layers. The second electrically nonconductive material has a second degree of fragility that is less than the first degree of fragility and a second dielectric constant that is greater than the first dielectric constant.

20 Claims, 1 Drawing Sheet

DIELECTRIC STACK

FIELD

This invention relates to the field of integrated circuit fabrication. More particularly, this invention relates to the formation of structures using low k materials, which structures can withstand anticipated stresses, such as the pressure applied to a bonding pad and underlying structures during a wire bonding or die probing process.

BACKGROUND

As integrated circuits have become increasingly smaller, electrically conductive structures within the integrated circuits are placed increasingly closer together. This situation tends to enhance the inherent problem of parasitic capacitance between adjacent electrically conductive structures. Thus, new electrically insulating materials have been devised for use between electrically conductive structures, to reduce such capacitance problems. The new electrically insulating materials typically have lower dielectric constants, and thus are generally referred to as low k materials. While low k materials help to resolve the capacitance problems described above, they unfortunately tend to introduce new challenges.

Low k materials are typically filled with small voids that help reduce the material's effective dielectric constant. Thus, there is less of the material itself within a given volume, which tends to reduce the structural strength of the material. The resulting porous and brittle nature of such low k materials presents new challenges in both the fabrication and packaging processes. Unless special precautions are taken, the robustness and reliability of an integrated circuit that is fabricated with low k materials may be reduced from that of an integrated circuit that is fabricated with traditional materials, because low k materials differ from traditional materials in properties such as thermal coefficient of expansion, moisture absorption, adhesion to adjacent layers, mechanical strength, and thermal conductivity.

Concerning the problem of thermal coefficient of expansion, when adjacent layers having different thermal coefficients of expansion are heated and cooled, such as occurs during the normal operation of an integrated circuit, the layers tend to expand and contract at different rates and to different degrees. These forces induce strains in the adjacent and proximal layers. Low k materials tend to have thermal coefficients of expansion that are sufficiently different from those of the other materials used to fabricate integrated circuits that such strains create problems, which may be both physical and electrical, in the integrated circuit.

As to the problem of moisture absorption, the porosity of low k materials makes them susceptible to absorbing the moisture that typically tends to diffuse into the packaged integrated circuit. As the low k material absorbs such moisture, the properties of the low k material changes. For example, the dielectric constant of the material changes, because the voids tend to fill with water or water vapor. The moisture in the voids may rapidly expand during subsequent heating operations such as baking or solder ball reflow, causing the layers of the integrated circuit to burst apart, resulting in dramatic device failure. The moisture absorbed by the low k material also tends to cause other problems, some of which are described in more detail below.

Integrated circuits containing low k materials are inherently more prone to delamination, either between the various layers of the integrated circuit itself, or between the integrated circuit and packaging materials, such as underfill and mold compound, or other materials which are in intimate contact with the integrated circuit. There are several probable causes for such delamination, including a reduction in the adhesion of a low k layer due to absorption of moisture, as described above. In addition, because the low k material tends to be very porous by nature, there is physically less material available to form adhesive bonds with adjacent layers. Further, the strains induced by differing thermal coefficients of expansion also tend to shear the low k layer from adjacent layers, which again tends to enhance the occurrence of delamination.

As to mechanical strength, low k materials are typically more brittle and have a lower breaking point than other materials. One reason for this is, again, the porosity of the low k material, where a significant percentage of its physical volume is filled with voids. Thus, integrated circuits containing low k materials are inherently more prone to breaking or cracking during processes where physical contact is made with the integrated circuit surface, such as wire bonding and electrical probing, or processes that cause bending stresses such as mold curing, underfill curing, solder ball reflow, or temperature cycling.

Finally, because of their porosity and other properties, low k materials tend to be very poor thermal conductors, typically much less than half a watt per meter-Kelvin (W/mK). This contrasts significantly with the thermal conductivity of traditional integrated circuit and packaging materials such as silicon (60–90 W/mK), copper 380–390 W/mK), mold compound (0.7–2 W/mK), or die attach material (2–4 W/mK). Thus, the thermal energy created during the normal operation of the integrated circuit tends to not be dissipated well by low k materials. Therefore, thermal energy tends to build up within the integrated circuit, and is expressed as localized areas of increased temperature, or hot spots.

There is a need, therefore, for new structures, processes, and materials for use in integrated circuit fabrication, which help to alleviate one or more of the challenges that are enhanced by the use of low k materials.

SUMMARY

The above and other needs are met by an integrated circuit with a pressure resistant current carrying structure having electrically conductive layers for carrying current. A first electrically nonconductive material at least partially surrounds the electrically conductive layers, and provides electrical insulation between the electrically conductive layers. The first electrically nonconductive material has a first degree of fragility and a first dielectric constant. A second electrically nonconductive material is disposed in a pattern within the first electrically nonconductive material and between the electrically conductive layers, and provides structural support for the first electrically nonconductive material between the electrically conductive layers. The second electrically nonconductive material has a second degree of fragility that is less than the first degree of fragility and a second dielectric constant that is greater than the first dielectric constant.

In this manner, the first electrically nonconductive material provides a high level of electrical insulation between the electrically conductive layers, with a very low degree of parasitic capacitance, because of the relatively low dielectric constant of the first electrically nonconductive material. However, the second electrically nonconductive material provides structural strength to the structure, because it has a lower degree of fragility than the first electrically nonconductive material. Thus, the first electrically nonconductive material is primarily used to provide the desired electrical insulation between the electrically conductive layers, and the second electrically nonconductive material is primarily used to provide structure support to the overall structure. Preferably, there is much less of the second electrically nonconductive material than there is of the first electrically nonconductive material, and there is only enough of the second electrically nonconductive material as is necessary to provide the desired structural support.

In various preferred embodiments, the electrically conductive layers are metal layers, and are most preferably copper layers. The first electrically nonconductive material is preferably a low k material where the first dielectric constant is less than about three, and the second dielectric constant of the second electrically nonconductive material is preferably greater than about three and one-half. The second electrically nonconductive material is most preferably a silicon oxide. The pattern is in one embodiment at least one of horizontal bars and vertical bars. In a second embodiment the pattern comprises a plurality of pillars.

In a preferred embodiment, an electrically conductive pressure dispersion layer is disposed in electrical contact with an electrically conductive upper bonding pad layer, and forms a grid pattern for receiving and dispersing pressure applied to the electrically conductive upper bonding pad layer such as during bonding and probing procedures. In this embodiment, the first electrically nonconductive material preferably at least partially surrounds the electrically conductive pressure dispersion layer. The pattern of the second electrically nonconductive material preferably matches the grid pattern of the electrically conductive pressure dispersion layer. Most preferably, the second electrically nonconductive material only underlies the grid pattern of the electrically conductive pressure dispersion layer.

In a further embodiment, the pressure resistant structure overlies additional active circuitry, which is preferably input output circuitry.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
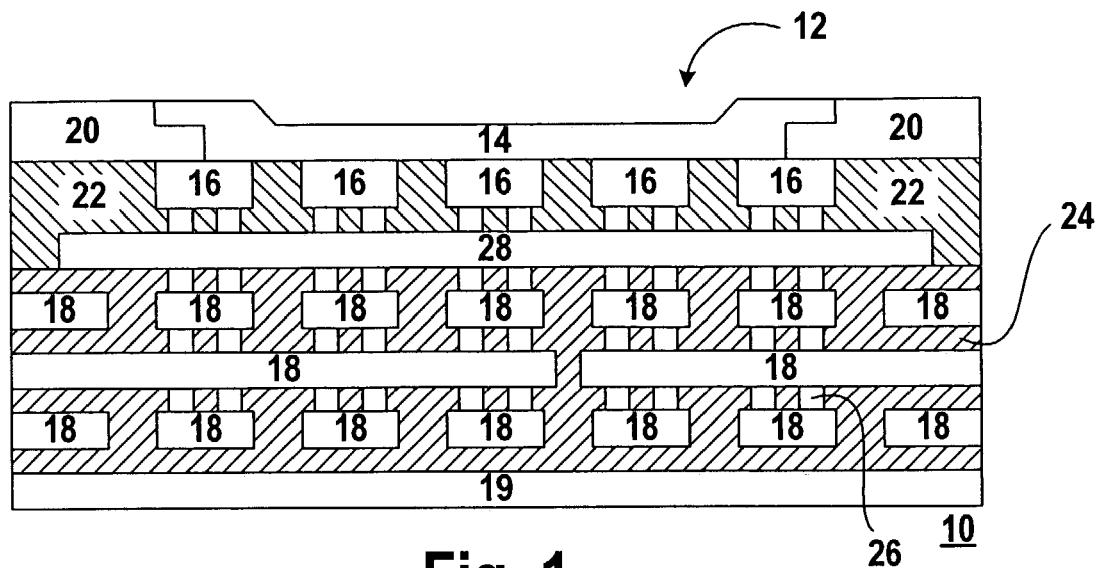
FIG. 1 is a cross sectional view of a portion of an integrated circuit, depicting a pressure resistant structure.

With reference now to FIG. 1, there is depicted a cross sectional view of a portion of an integrated circuit 10, more particularly depicting a pressure resistant structure 12. The pressure resistant structure 12 is most preferably a bonding pad stack 12, such as is used to form wire bond electrically connections to the integrated circuit 10, or to electrically probe the integrated circuit 10. As both the wire boding operation and the electrical probing operation apply pressure to the bonding pad stack 12, it is desirable that the bonding pad stack 12 have sufficient structure strength to resist the anticipated pressure to be applied, such that the bonding pad stack 12 and any underlying circuitry is not damaged during those processes which apply the pressure. However, it is also desirable to use low k materials in the fabrication of the bonding pad stack 12, so as to realize the benefits described above. Unfortunately, low k materials are not sufficiently resistant to the anticipated pressure of a bonding or probing operation, and tend to crack during such processes. Thus, the novel structure 12 as described in more detail below overcomes these issues.

Figure 2:
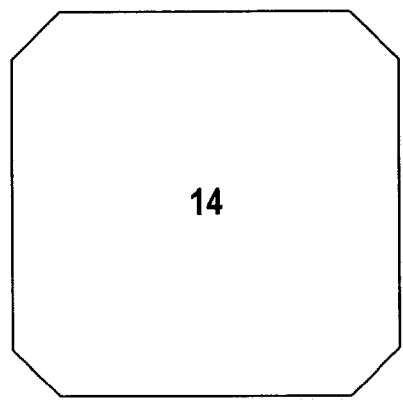
FIG. 2 is a top plan view of an electrically conductive upper bonding pad layer from the structure of FIG. 1.

The bonding pad stack 12 preferably includes an electrically conductive upper bonding pad layer 14, which is preferably formed of at least one metal layer, and is most preferably formed of aluminum. The electrically conductive upper bonding pad layer 14 may also include materials such as gold, tantalum, tantalum nitride, and other materials such as to enhance conductivity, enhance adhesion to surrounding layers, and reduce corrosion, as are known in the art. The electrically conductive upper bonding pad layer 14 is most preferably laterally surrounded by a passivation layer 20, such as a silicon oxide layer. A top plan view of a preferred embodiment of the electrically conductive upper bonding pad layer 14 is given in FIG. 2. It is appreciated that the exact shape of the electrically conductive upper bonding pad layer 14 may be adjusted so as to fit design constraints within the integrated circuit 10.

Figure 3:
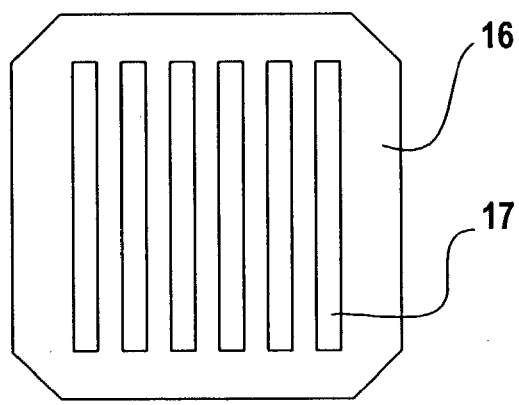
FIG. 3 is a top plan view of an electrically conductive pressure dispersion layer from the structure of FIG. 1.

The electrically conductive upper bonding pad layer 14 is preferably in electrical contact with and directly overlies an electrically conductive pressure dispersion layer 16. The electrically conductive pressure dispersion layer 16 is preferably formed in a grid pattern, as depicted in a top plan view in FIG. 3. It is appreciated that the size, shape, and number of voids 17 within the electrically conductive pressure dispersion layer 16 is variable. However, the electrically conductive pressure dispersion layer 16 most preferably has the general shape as depicted in FIG. 3, with a grid pattern of bars oriented in a single direction, surrounded by a border of horizontal and vertical bars.

The bars and voids within the electrically conductive pressure dispersion layer 16 allow the electrically conductive pressure dispersion layer 16 to transfer at least a portion of the pressure that it receives from the electrically conductive upper bonding pad layer 14 during bonding and probing processes in a horizontal component, meaning generally parallel to the surface of the integrated circuit 10, rather than passing all of the pressure so received in a vertical component, meaning down to the underlying layers of the integrated circuit 10.

The electrically conductive pressure dispersion layer 16 is most preferably formed of copper, but may alternately be formed of at least one other electrically conductive material, such as to enhance adhesion to surrounding layers or reduce diffusion or other cross contamination with adjacent layers. However, copper tends to be preferred because of its balance of high strength and high conductivity relative to many other materials.

The electrically conductive pressure dispersion layer 16 preferably overlies additional electrically conductive layers, such as layers 28 and 18. The electrically conductive pressure dispersion layer 16 is preferably at least partially surrounded with an electrically nonconductive material 22. In various embodiments, the electrically nonconductive material 22 is one or more of a convention dielectric, such as a silicon dioxide, a low k material, or an ultra low k material. The additional electrically conductive layers 28 and 18 are preferably at least partially surrounded with either a low k material or an ultra low k material 24.

As used herein, the term conventional dielectric refers to an electrically nonconductive material having a dielectric constant that is greater than about three and one-half, a low k material is an electrically nonconductive material having a dielectric constant that is between about two and one-half and about three, and an ultra low k material is an electrically nonconductive material having a dielectric constant that is less than about two and one-half.

The lower electrically conductive layers 18 are preferably at least partially surrounded by a first low k or ultra low k material 24 because they are carrying different electrical signals, one from another, and thus a higher degree of electrical separation with a lower degree of parasitic capacitance is desirable. However, the electrically conductive pressure dispersion layer 16 and the electrically conductive upper bonding pad layer 14, and also possibly the next immediate underlying electrically conductive layer 28 tend to carry the same signal, and are larger electrically conducting layers. Therefore, cross talk between these layers tends to not be much of a problem, and parasitic capacitance also tends to be less of a problem.

Additional structural strength is provided to the bonding pad structure 12 by a second dielectric material 26 that is disposed in a pattern within the first dielectric material 24 between the electrically conductive layers 16, 28, and 18. The second dielectric material 26 is preferably a conventional dielectric material, which although it does not have the favorable low capacitance properties of the surrounding first dielectric material 24, provides structural support to the bonding pad structure 12 because it has a lower degree of fragility, meaning that it is less fragile and therefore less susceptible to breaking under pressure.

Figure 4:
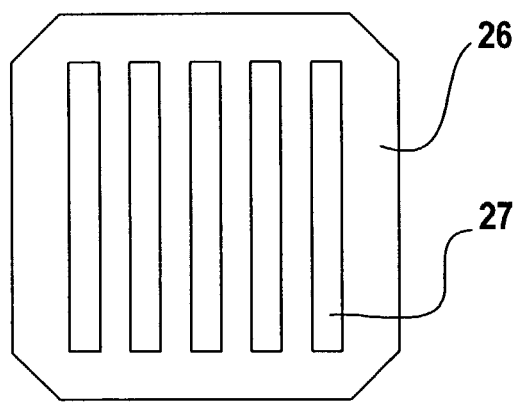
FIG. 4 is a top plan view of a first embodiment of a pattern for a second electrically nonconductive material from the structure of FIG. 1.
Figure 5:
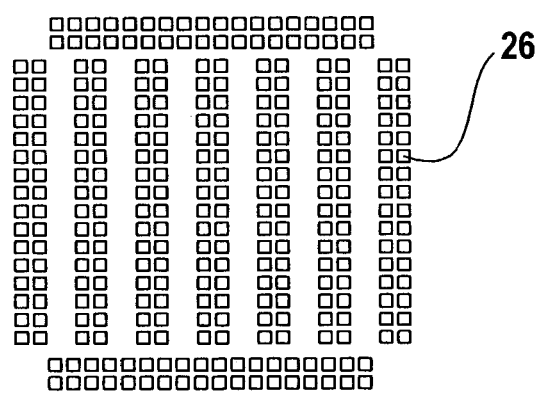
FIG. 5 is a top plan view of a second embodiment of a pattern for a second electrically nonconductive material from the structure of FIG. 1.

In a preferred embodiment the second dielectric material 26 preferably has the same pattern as the pressure dispersion layer 16, as depicted in top plan view in FIG. 4. In this embodiment, the second dielectric material 26 also has cut outs 27, generally matching the cut outs 17 of the second dielectric material 16. Most preferably, the second dielectric material 26 directly and only underlies the pressure dispersion layer 16. In a most preferred embodiment, the second dielectric material 26 is formed into pillars that run generally vertically between the electrically conductive layers 16, 28, and 18. In this manner, there is less of the second dielectric material to provide capacitance problems in and between the electrically conductive layers 16, 28, and 18, but there is a sufficient amount of the second dielectric material 26 extending vertically through the structure 12 to provide adequate structural support to resist cracking when pressure is applied to the upper bonding pad layer 14.

In a most preferred embodiment, the structure 12 overlies additional active circuitry 19, such as input output circuits. In this manner, the space required for an input output cell, having both active circuitry and a bonding pad, is reduced, thereby allowing the overall size of the die on which the integrated circuit is formed to also be reduced, or alternately to provide space for additional circuitry within a die of the same size. Thus, either smaller or higher density devices can be formed with low k materials, while preserving the structural integrity of the devices and structures disposed beneath the structural element 12.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. In an integrated circuit, the improvement comprising a pressure resistant current carrying structure having:
   electrically conductive layers for carrying current,
   a first electrically nonconductive material at least partially surrounding the electrically conductive layers, the first electrically nonconductive material providing electrical insulation between the electrically conductive layers, the first electrically nonconductive material having a first degree of fragility and a first dielectric constant, wherein the first electrically nonconductive material directly contacts and underlies a bottom surface of an overlying electrically conductive layer below which it is disposed and a top surface of an underlying electrically conductive layer above which it is disposed, and
   a second electrically nonconductive material disposed in a pattern within the first electrically nonconductive material between the electrically conductive layers, the second electrically nonconductive material providing structural support for the first electrically nonconductive material between the electrically conductive layers, the second electrically nonconductive material having a second degree of fragility that is less than the first degree of fragility and a second dielectric constant that is greater than the first dielectric constant, wherein the second electrically nonconductive material directly contacts a bottom surface of an overlying electrically conductive layer below which it is disposed and a top surface of an underlying electrically conductive layer above which it is disposed.

2. The integrated circuit of claim 1, wherein the electrically conductive layers comprise metal layers.

3. The integrated circuit of claim 1, wherein the electrically conductive layers comprise copper layers.

4. The integrated circuit of claim 1, wherein the first dielectric constant is less than about three.

5. The integrated circuit of claim 1, wherein the second dielectric constant of the second electrically nonconductive material is greater than about three and one-half.

6. The integrated circuit of claim 1, wherein the second electrically nonconductive material comprises a silicon oxide.

7. The integrated circuit of claim 1, wherein the pattern comprises horizontal bars.

8. The integrated circuit of claim 1, wherein the pattern comprises vertical bars.

9. The integrated circuit of claim 1, wherein the pattern comprises horizontal and vertical bars.

10. The integrated circuit of claim 1, wherein the pattern comprises a plurality of pillars.

11. In an integrated circuit, the improvement comprising a pressure resistant bonding pad structure having:
    an electrically conductive upper bonding pad layer, an electrically conductive pressure dispersion layer in electrical contact with the electrically conductive upper bonding pad layer, the electrically conductive pressure dispersion layer forming a grid pattern for receiving and dispersing pressure applied to the electrically conductive upper bonding pad layer such as during bonding and probing procedures, additional electrically conductive layers underlying the electrically conductive pressure dispersion layer, a first electrically nonconductive material at least partially surrounding the additional electrically conductive layers, the first electrically nonconductive material providing electrical insulation between the additional electrically conductive layers, the first electrically nonconductive material having a first degree of fragility and a first dielectric constant, wherein the first electrically nonconductive material directly contacts and underlies a bottom surface of an overlying electrically conductive layer below which it is disposed and a top surface of an underlying electrically conductive layer above which it is disposed, and a second electrically nonconductive material disposed in a pattern within the first electrically nonconductive material between the electrically conductive pressure dispersion layer and the additional electrically conductive layers, the second electrically nonconductive material providing structural support for the first electrically nonconductive material between the additional electrically conductive layers, the second electrically nonconductive material having a second degree of fragility that is less than the first degree of fragility and a second dielectric constant that is greater than the first dielectric constant, wherein the second electrically nonconductive material directly contacts a bottom surface of an overlying electrically conductive layer below which it is disposed and a top surface of an underlying electrically conductive layer above which it is disposed.

12. The integrated circuit of claim 11, wherein the first electrically nonconductive material further at least partially surrounds the electrically conductive pressure dispersion layer.

13. The integrated circuit of claim 11, wherein the pattern of the second electrically nonconductive material matches the grid pattern of the electrically conductive pressure dispersion layer.

14. The integrated circuit of claim 11, wherein the second electrically nonconductive material only underlies the grid pattern of the electrically conductive pressure dispersion layer.

15. The integrated circuit of claim 11, wherein the electrically conductive pressure dispersion layer comprises copper.

16. The integrated circuit of claim 11, wherein the first dielectric constant is less than about three.

17. The integrated circuit of claim 11, wherein the second electrically nonconductive material comprises silicon dioxide.

18. The integrated circuit of claim 11, wherein the pattern comprises a plurality of pillars underlying the grid pattern of the electrically conductive pressure dispersion layer.

19. In an integrated circuit, the improvement comprising a pressure resistant bonding pad structure having:

an electrically conductive upper bonding pad layer, an electrically conductive pressure dispersion layer in electrical contact with the electrically conductive upper bonding pad layer, the electrically conductive pressure dispersion layer forming a grid pattern for receiving and dispersing pressure applied to the electrically conductive upper bonding pad layer such as during bonding and probing procedures, additional electrically conductive layers underlying the electrically conductive pressure dispersion layer, a first electrically nonconductive material at least partially surrounding the additional electrically conductive layers, the first electrically nonconductive material providing electrical insulation between the additional electrically conductive layers, the first electrically nonconductive material having a first degree of fragility and a first dielectric constant, wherein the first electrically nonconductive material directly contacts and underlies a bottom surface of an overlying electrically conductive layer below which it is disposed and a top surface of an underlying electrically conductive layer above which it is disposed, a second electrically nonconductive material disposed in a pattern within the first electrically nonconductive material between the electrically conductive pressure dispersion layer and the additional electrically conductive layers, the second electrically nonconductive material providing structural support for the first electrically nonconductive material between the additional electrically conductive layers, the second electrically nonconductive material having a second degree of fragility that is less than the first degree of fragility and a second dielectric constant that is greater than the first dielectric constant, wherein the second electrically nonconductive material directly contacts a bottom surface of an overlying electrically conductive layer below which it is disposed and a top surface of an underlying electrically conductive layer above which it is disposed, and additional active circuitry underlying the additional electrically conductive layers, the additional active circuitry protected from pressure applied to the electrically conductive upper bonding pad layer by the electrically conductive pressure dispersion layer and the second electrically nonconductive material.

20. The integrated circuit of claim 19, wherein the additional active circuitry comprises input output circuitry.

* * * * *